United States Patent [19]

Suzuki

[11] 3,769,523

[45] Oct. 30, 1973

[54] LOGIC CIRCUIT ARRANGEMENT USING INSULATED GATE FIELD EFFECT TRANSISTORS

[75] Inventor: Yasoji Suzuki, Kawasaki, Japan

[73] Assignee: Tokyo Shibaura Electric Co., Ltd., Kawasaki-shi, Japan

[22] Filed: Jan. 26, 1973

[21] Appl. No.: 327,243

Related U.S. Application Data

[62] Division of Ser. No. 148,876, June 1, 1971, abandoned.

[30] Foreign Application Priority Data

May 30, 1970 Japan ................ 45/46155
May 29, 1971 Japan ................ 46/36812

[52] U.S. Cl. ................ 307/205, 307/251
[51] Int. Cl. ................ H03k 19/08
[58] Field of Search ................ 307/205, 251, 304, 307/279, 221 C

[56] References Cited

UNITED STATES PATENTS

| | | | |
|---|---|---|---|
| 3,449,594 | 6/1969 | Gibson et al. | 307/251 |
| 3,431,433 | 3/1969 | Ball | 307/251 |
| 3,356,858 | 12/1967 | Wanlass | 307/205 |
| 3,322,974 | 5/1967 | Ahrons | 307/304 |
| 3,541,353 | 11/1970 | Seelbach | 307/205 |
| 3,501,751 | 3/1970 | Gerraro | 307/251 |

OTHER PUBLICATIONS

Ruoff "FET Logic Circuit" Pages 265–266, Vol. 7, No. 3, 8–64 IBM Technical Disclosure Bulletin.

Rapp "Complementary FET Logic Gate" RCA Tech. Notes RCA TN, No. 676 6–66.

*Primary Examiner*—John W. Huckert
*Assistant Examiner*—R. E. Hart
*Attorney*—Leonard Holtz

[57] ABSTRACT

A NAND/NOR logic circuit arrangement includes a plurality of logic circuit units, each of which is formed of a pair of enhancement type IGFET having one P channel and one N channel connected in complementary relationship to each other. The gates of the paired IGFET of the logic circuit units are jointly connected to the corresponding input terminals and the drains thereof jointly to the corresponding output terminals. The sources of the P type IGFET of the logic circuit units are grounded. The source of the N type IGFET of a first logic circuit unit is connected to a negative bias power source and the sources of the N type IGFET of a second and succeeding logic circuit units to the output terminals of the respective immediately preceding logic circuit units. The substrate electrodes of the P type IGFET are grounded and those of the N type IGFET are connected to the negative bias power source. When the input terminals of the logic circuit units are supplied with inputs combined in arbitrary forms in which the grounding voltage and the voltage of the negative bias power source are taken as 1 and 0 digits respectively of the binary logic level or vice versa, is so designed as to produce from the output terminals logic outputs corresponding to the combinations of inputs up to the associated logic circuit units.

2 Claims, 12 Drawing Figures

PATENTED OCT 30 1973 3,769,523

SHEET 2 OF 8

LOGIC CIRCUIT ARRANGEMENT USING INSULATED GATE FIELD EFFECT TRANSISTORS

This is a division, of application Ser. No. 148,876, now abandoned, filed June 1, 1971.

This invention relates to a logic circuit arrangement formed of a plurality of logic circuit units each including a pair of enhancement type insulated gate field effect transistors (hereinafter referred to as "IGFET") of one P channel and one N channel connected in complementary relationship, and more particularly to a logic circuit arrangement capable of a multiplex logic operation.

The above-mentioned IGFET is prominently characterized in that it particularly has a higher input and noise resistance and consumes less amounts of stand by power than, for example, other ordinary bipolor transistors. In recent years, therefore, IGFET has come to be favorably accepted in many applications.

FIG. 1 illustrates the prior art 3-input NAND/NOR logic circuit arrangement using three pairs of enhancement type IGFET of different channels connected in complementary relationship as described above. According to this arrangement, there are commonly connected the gate electrodes G (hereinafter simply referred to as "the gate") of three pairs of P and N type IGFET indicated as 11P–11N, 12P–12N and 13P–13N to the corresponding input terminals $I_1$, $I_2$ and $I_3$. The source electrodes S (hereinafter simply referred to as "the source") of the P type IGFET 11P, 12P and 13P are grounded, and the drain electrodes D (hereinafter simply referred to as "the drain") are jointly connected to a common output terminal O. The source S of the N type IGFET 11N having its gate G connected to the input terminal $I_1$ is connected to a negative bias power source −V having proper voltage (ordinarily −12 or −24 volts). The drain D of this IGFET 11N is connected to the source S of the N type IGFET 12N having its gate G connected to the input terminal $I_2$. The drain D of the IGFET 12N is connected to the source S of the N type IGFET 13N having its gate G connected to the input terminal $I_3$. The substrate electrodes Sub of the P type IGFET 11P and 13P are grounded and the substrate electrodes Sub of the N type IGFET 11N to 13N are connected to the bias power source −V.

According to the aforesaid logic circuit arrangement, when there is used a positive logic where the voltage −V volts of the aforesaid bias power source is taken as 0 of a binary logic level and the grounding voltage of zero volt is taken as 1 of the binary logic level, then there is obtained 0 output from the output terminal O only when the input terminals $I_1$ to $I_3$ are all supplied with 1. In all other cases, there is obtained 1 output from the output terminal O. Accordingly, the subject logic circuit arrangement acts as the so-called NAND logic gate circuit. Namely, when the input terminals $I_1$ to $I_3$ are all supplied with 0 input, the input capacitance Cin present between the input terminal and the ground as indicated in an imaginary line in FIG. 1 (which is mainly the gate capacitance of the corresponding IGFET) is charged to 0 voltage level, that is, −V volts to bring all the P type IGFET 11P to 13P to a conducting state and all the N type IGFET 11N to 13N to a nonconducting state. As a result, the voltage of the output terminal O is rendered equal to the grounding voltage to generate 1 output. When, under such conditions, the input terminals $I_1$ to $I_3$ are supplied with 1 input, then all the P type IGFET 11P to 13P are rendered nonconducting and all the N type IGFET 11N to 13N are rendered conducting. The energy charged in the input capacitance Cin is discharged through the corresponding N type IGFET thus rendered conducting. As a result, the output terminal O has equal voltage to the voltage −V of the bias power source to produce 0 output.

When any one of the input terminals $I_1$ to $I_3$ is supplied with 0 input and the others with 1 input, then P type IGFET corresponding to said one input terminal is made conducting (the other P type IGFET are all rendered nonconducting) and the corresponding N type IGFET is brought to a nonconducting state (the other N type IGFET are made conducting). In this case, the output terminal O has equal voltage to the grounding voltage as in the case where the input terminals are all supplied with 0 input, thus producing 1 output. When the aforesaid positive logic is operated, the circuit arrangement of FIG. 1 performs the NAND logic function bearing a relationship of $0=\overline{I_1 \times I_2 \times I_3}$. Conversely, when there is operated the negative logic in which the voltage −V volt of the bias power source is taken as 1 of the binary logic level and the grounding voltage 0 volt as 0 of the binary logic level, then the circuit arrangement of FIG. 1 allows the output terminal O to produce 1 only when the input terminals $I_1$ to $I_3$ are all supplied with 0 input. In all the other cases, the output terminal O generates 0 output. In this case the circuit arrangement of FIG. 1 is known to act as a NOR logic gate circuit. Tables 1 and 2 below present truth volues when there are conducted the NAND and NOR operations.

Table 1(NAND)

| $I_1$ | $I_2$ | $I_3$ | O |
|---|---|---|---|
| 0 | 0 | 0 | 1 |
| 0 | 0 | 1 | 1 |
| 0 | 1 | 0 | 1 |
| 0 | 1 | 1 | 1 |
| 1 | 0 | 0 | 1 |
| 1 | 0 | 1 | 1 |
| 1 | 1 | 0 | 1 |
| 1 | 1 | 1 | 0 |

Table 2(NOR)

| $I_1$ | $I_2$ | $I_3$ | O |
|---|---|---|---|
| 1 | 1 | 1 | 0 |
| 1 | 1 | 0 | 0 |
| 1 | 0 | 1 | 0 |
| 1 | 0 | 0 | 0 |
| 0 | 1 | 1 | 0 |
| 0 | 1 | 0 | 0 |
| 0 | 0 | 1 | 0 |
| 0 | 0 | 0 | 1 |

FIG. 2 shows the prior art 3-input NOR/NAND logic circuit using the same type of IGFET as in the preceding case. In FIG. 2, connection of the P type IGFET 13 P with the N type IGFET 11N to 13N is reversed from what is used in the circuit arrangement of FIG. 1, and in consequence the grounding terminal and negative bias power source −V are properly connected to match said reverse assembly. Namely, in FIG. 1 the P type IGFET 11P to 13P are connected in parallel and the N type IGFET 11N to 13N are connected in series, whereas, in FIG. 2, the N type IGFET 11N to 13N are connected in parallel and the P type IGFET 11P to 13P are connected in series. The drains D of the N type IGFET 11N to 13N are jointly connected to the output terminal O, and their sources S are jointly connected to the negative bias power source —V. The source S of the P type IGFET 11P having its gate G connected to the input terminal $I_1$ is grounded, and the drain D of the P type IGFET 13P having its gate G connected to the input terminal $I_3$ is connected to the output terminal O.

Under the aforesaid circuit arrangement, the P type IGFET 11P to 13P and N type IGFET 11N to 13N perform exactly the same action with respect to 1 and 0 inputs of the binary logic level as in the circuit arrangement of FIG. 1. It will be apparent, therefore, that the circuit arrangement of FIG. 2 is actuated in the same way as that of FIG. 1, excepting that outputs from the output terminal O associated with the positive and negative logic operations are reversed from those obtained in FIG. 1. In other words, the circuit arrangement of FIG. 2 acts as a NOR logic gate circuit in the positive logic operation and as a NAND logic gate circuit in the negative logic operation.

It should be noted in this connection that any of the prior art logic circuit arrangement was so designed as to have only a single output terminal common to all the input terminals regardless of its number (generally more than two), so that such arrangement simultaneously produced only one output with respect to the positive and negative logic, namely performed only a single function with respect to the positive and negative logic.

However, when the aforesaid logic circuit arrangement is put to practical application it is often desired to obtain the output of the positive or negative logic up to a given input terminal in addition to the output of the positive or negative logic with respect to all inputs.

This invention has been accomplished in view of such situation and is intended to provide a logic circuit arrangement wherein each logic circuit unit has one input terminal and one output terminal, thereby enabling an n number of positive logic outputs and the same number of negative logic outputs to be obtained at the same time when the subject circuit arrangement has an *n* number of input terminals so as to produce the same number of positive and negative logic outputs up to a given input terminal.

According to an aspect of this invention, there is provided a logic circuit arrangement comprising a plurality of logic circuit units connected in complementary relationship, in each of which there are used a pair of enhancement type IGFET having one P channel and one N channel, the gates of the paired IGFET are connected to the corresponding input terminals and either of the drains and sources of said each paired IGFET are connected to the corresponding output terminals; means for grounding either of the sources and drains of the P type IGFET of the logic circuit units; means for connecting either of the source and drain of the N type IGFET of a first logic circuit unit to a negative bias power source and either of the sources and drains of the N type IGFET of a second and succeeding logic circuit units to the output terminals of the respective immediately preceding logic circuit units; means for grounding the substrate electrodes of the P type IGFET of the logic circuit units and connecting those of the N type IGFET thereof to the negative bias power source; and means which, when the input terminals of the logic circuit units are supplied with inputs combined in arbitrary forms in which the grounding voltage and the voltage of the negative bias power source are taken as 1 and 0 rows respectively of the binary logic levels or vice versa, is capable of producing from the output terminals logic outputs corresponding to the associated logic circuit units.

The present invention can be more fully understood from the following detailed description when taken in conjunction with reference to the appended drawings, in which.

Figure 3:
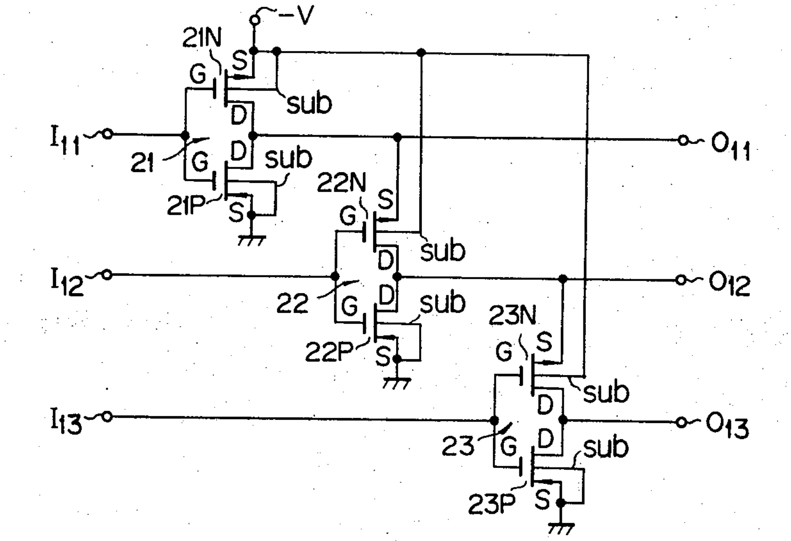
Figure 4:
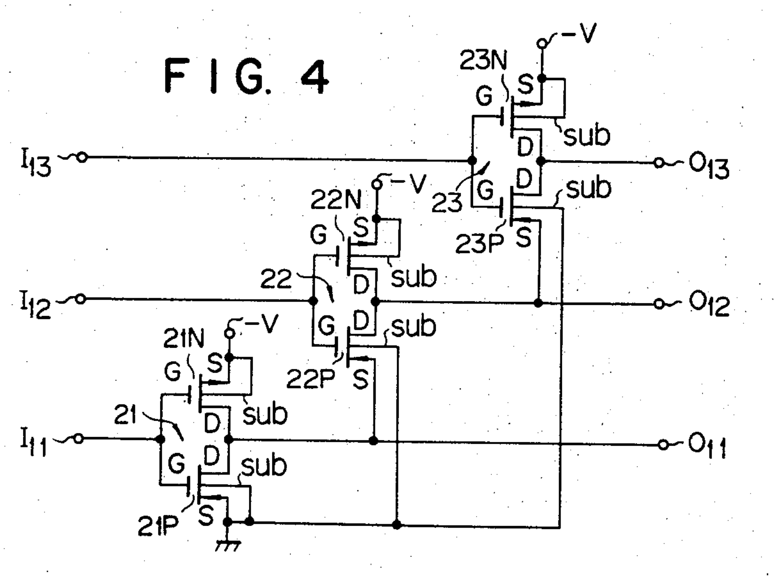
Figure 5:
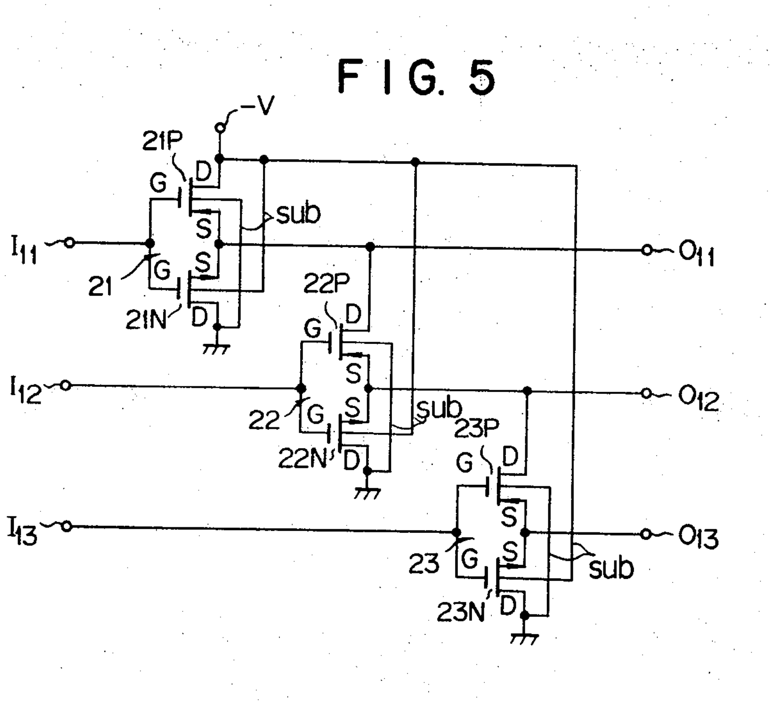
Figure 6:
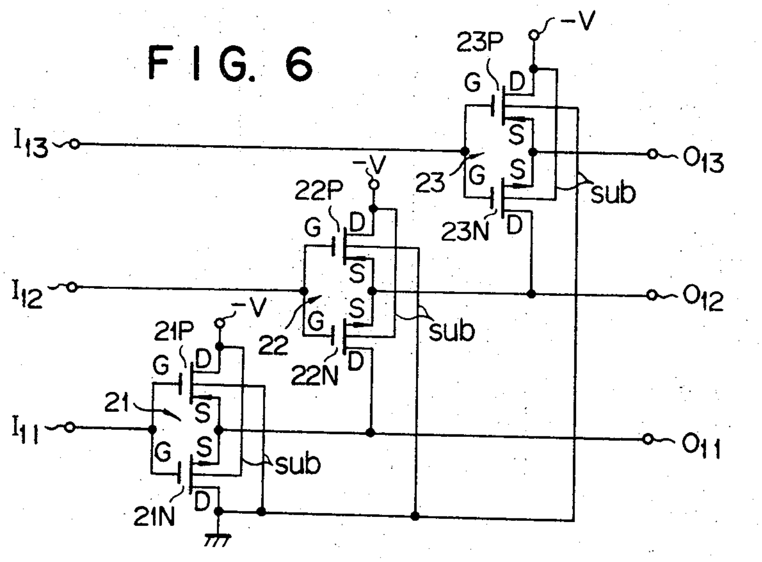
Figure 7:
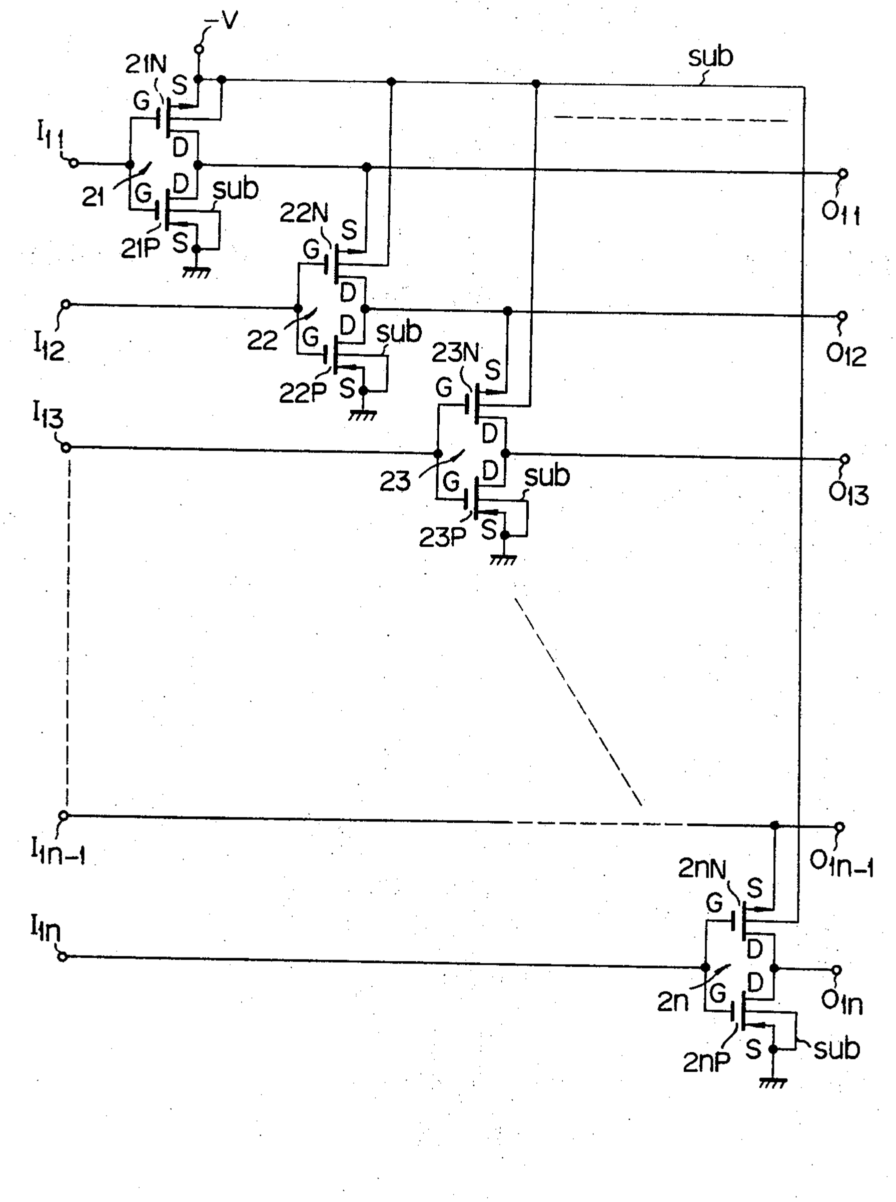
Figure 8:
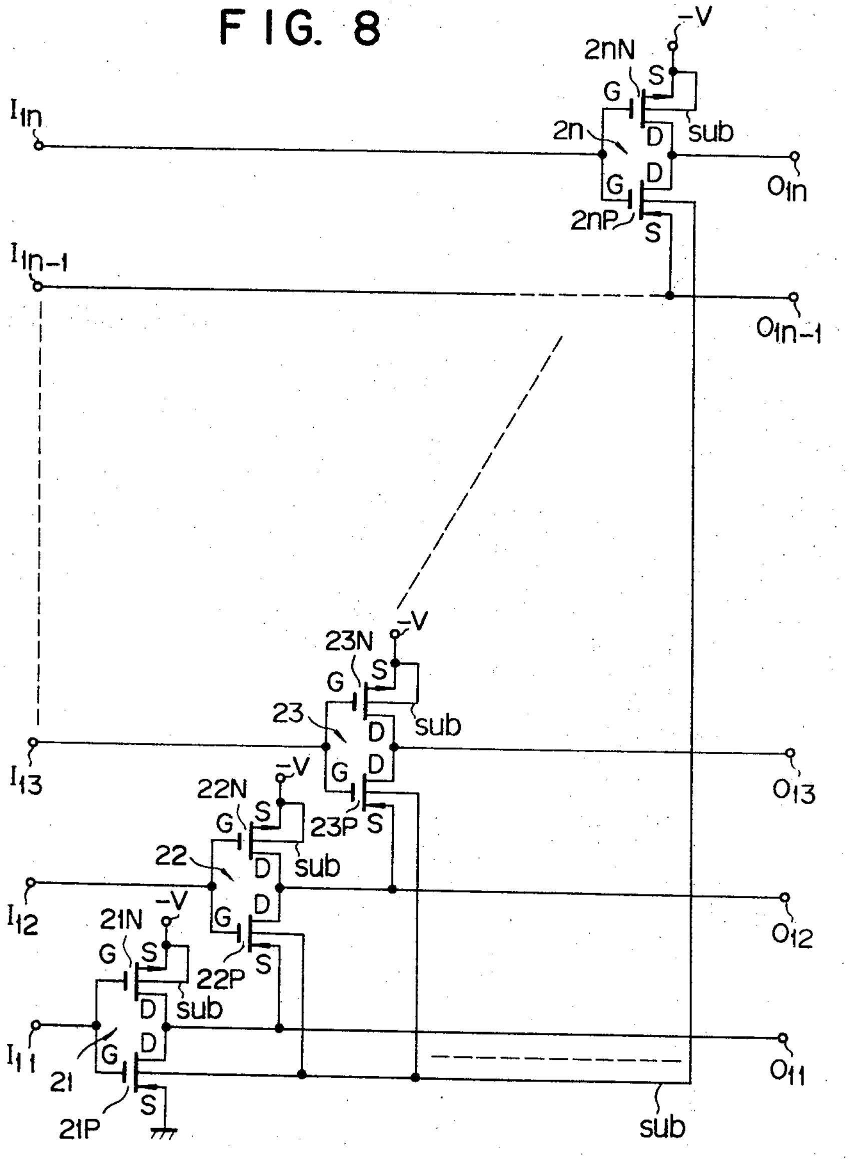

FIG. 3 indicates a NAND/NOR logic circuit arrangement using IGFET according to an embodiment of this invention;

FIG. 4 illustrates a NOR/NAND logic circuit arrangement using IGFET according to another embodiment of the invention;

FIG. 5 shows an OR/AND logic circuit arrangement according to still another embodiment of the invention;

FIG. 6 represents an AND/OR logic circuit arrangement according to a further embodiment of the invention;

FIGS. 7 and 8 illustrate a NAND/NOR and a NOR/-NAND logic circuit arrangements according to the invention for handling an n number of inputs; and FIGS. 9, 10, 11 and 12 are the logic circuit arrangements of the invention improved from those of FIGS. 3, 4, 7 and 8 respectively.

There will now be described by reference to the appended drawings the embodiments of a logic circuit arrangement using IGFET according to the invention.

Referring to FIG. 3 showing a 3-input NAND/NOR circut arrangement according to an embodiment of the invention, there are connected in complementary relationship three pairs of enhancement type IGFET each consisting of one P type and one N type unit as 21P–21N, 22P–22N and 23P–23N to constitute first to third logic circuit units respectively.

The gates G of the P and N type IGFET of the logic circuit units 21 to 23 are jointly connected to the corresponding first to third input terminals $I_{11}$, $I_{12}$ and $I_{13}$ respectively, and the drains D of said IGFET are jointly connected to the corresponding first to third output terminals $O_{11}$, $O_{12}$ and $O_{13}$. The sources S of the P type IGFET 21P to 23P of the logic circuit units 21 to 23 are grounded. The source S of the N type IGFET 21N of the first logic circuit unit 21 is connected to a negative bias power source —V having a proper voltage (—12 or —24 volts are most practical). The source S of the N type IGFET 22N of the second logic circuit unit 22 is connected to the first output terminal $O_{11}$ and the source S of the N type IGFET 23N of the third logic circuit unit 23 is connected to the second ouput terminal $O_{12}$. The substrate electrodes Sub of the P type IGFET 21P to 23P are grounded, and the substrate electrodes Sub of the N type IGFET 21N to 23N are connected to the negative bias power source —V.

According to the aforementioned circuit arrangement of this invention, when there is conducted the positive logic operation wherein the voltage —V volts of the bias power source is taken as 0 of the binary logic level and the grounding voltage 0 volt as 1 of the binary logic level, then the P type IGFET 21N to 23N are all made nonconducting and the N type IGFET 21N to 23N are all made nonconducting where the input terminals $I_{11}$ to $I_{13}$ are all supplied with 0 input. Accordingly, the output terminals $O_{11}$ to $O_{13}$ have equal voltage to the grounding voltage to generate 1 output. Conversely when the input terminals $I_{11}$ to $I_{13}$ are all supplied with 1 input, the N type IGFET 21N to 23N are brought to a conducting state and the P type IGFET 21P to 23P to a nonconducting state. As a result, the output terminals $O_{11}$ to $O_{13}$ have equal voltage to the voltage $-V$ volts of the bias power source to generate 0 output.

Figure 1:
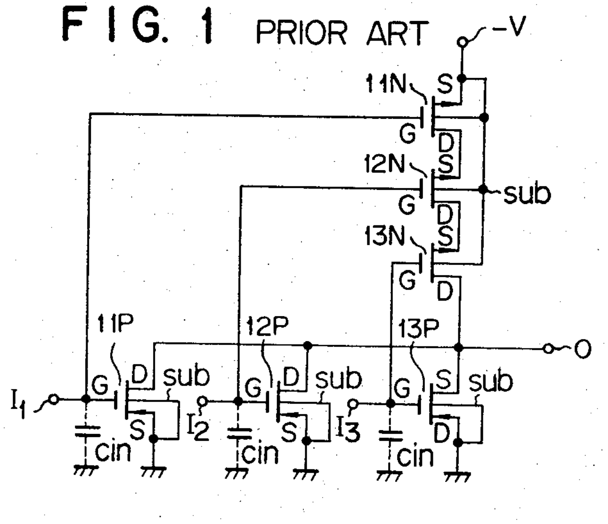
FIG. 1 PRIOR ART
FIG. 1 shows the prior art NAND/NOR logic circuit arrangement using IGFET.
Figure 2:
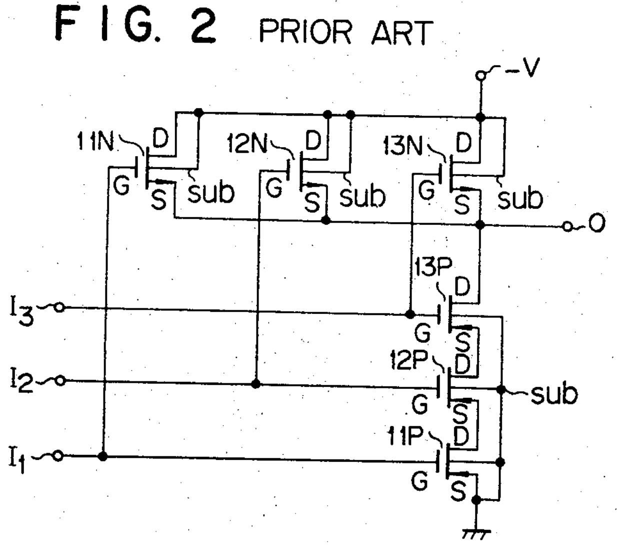
FIG. 2 PRIOR ART
FIG. 2 represents the prior art NOR/NAND logic circuit arrangement using IGFET.

When any of the input terminals $I_{11}$ to $I_{13}$ is supplied with 0 input (the others are supplied with 1 input), then the P type IGFET corresponding to said one input terminal is rendered conducting (the others are made nonconducting) and the N type IGFET corresponding to said one input terminal is brought to a nonconducting state (the others are rendered conducting). Accordingly, the logic circuit units 21 to 23 of FIG. 3 act as a sort of inverter circuit where the inputs and output are inverted in phase, producing from the third output terminal $O_{13}$ NAND output in which there exists the relationship of $O_{13}=\overline{I_{11}\times I_{12}\times I_{13}}$ exactly as in the conventional circuit arrangement. Namely, up to this point, the circuit arrangement of the present invention performs the same function as the prior art circuit arrangement of FIG. 1. The difference between the present (FIG. 3) and conventional (FIG. 1) circuit arrangement is that the first output terminal $O_{11}$ produces output $O_{11}=\overline{I_{11}}$ derived from inversion of an input signal and the second output terminal $O_{12}$ generates NAND output in which there exists the relationship of $O_{12}=\overline{I_{11}\times I_{12}}$. therefore, the circuit arrangement of FIG. 3 according to this invention performs three NAND functions:

$$O_{11}=\overline{I_{11}}$$
$$O_{12}=\overline{I_{11}\times I_{12}}$$
$$O_{13}=\overline{I_{11}\times I_{12}\times I_{13}}$$

When there is conducted a negative logic operation in which the voltage $-V$ volts of the bias power source is taken as 1 of the binary logic level and the grounding voltage 0 volt is taken as 0 of the binary logic level, then said circuit arrangement of FIG. 3 obviously carries out three NOR operations:

$$O_{11}=\overline{I_{11}}$$
$$O_{12}=\overline{I_{11}+I_{12}}$$
$$O_{13}=\overline{I_{11}+I_{12}+I_{13}}$$

Tables 3 and 4 below give the truth values associated with the NAND and NOR operations.

Table 3(NAND)

| $I_{11}$ | $I_{12}$ | $I_{13}$ | $O_{11}$ | $O_{12}$ | $O_{13}$ |
|---|---|---|---|---|---|
| 0 | 0 | 0 | 1 | 1 | 1 |
| 0 | 0 | 1 | 1 | 1 | 1 |
| 0 | 1 | 0 | 1 | 1 | 1 |
| 0 | 1 | 1 | 1 | 1 | 1 |
| 1 | 0 | 0 | 0 | 1 | 1 |
| 1 | 0 | 1 | 0 | 1 | 1 |
| 1 | 1 | 0 | 0 | 0 | 1 |
| 1 | 1 | 1 | 0 | 0 | 0 |

Table 4(NOR)

| $I_{11}$ | $I_{12}$ | $I_{13}$ | $O_{11}$ | $O_{12}$ | $O_{13}$ |
|---|---|---|---|---|---|
| 1 | 1 | 1 | 0 | 0 | 0 |
| 1 | 1 | 0 | 0 | 0 | 0 |
| 1 | 0 | 1 | 0 | 0 | 0 |
| 1 | 0 | 0 | 0 | 0 | 0 |
| 0 | 1 | 1 | 1 | 0 | 0 |
| 0 | 1 | 0 | 1 | 0 | 0 |
| 0 | 0 | 1 | 1 | 1 | 0 |
| 0 | 0 | 0 | 1 | 1 | 1 |

FIG. 4 shows a NOR/NAND logic circuit arrangement according to another embodiment of this invention. The P type IGFET 21P and N type IGFET 21N of the first logic circuit unit 21 are connected in the same way as in FIG. 3. However, the source S of the P type IGFET 22P of the second logic circuit unit 22 is not grounded as in FIG. 3, but is connected to the first output terminal $O_{11}$. The source S of the N type IGFET 22N is not connected to the first output terminal $O_{11}$ as in FIG. 3, but is connected to the negative bias power source $-V$. The source S of the P type IGFET 23P of the third logic circuit unit 23 is not grounded as in FIG. 3, but is connected to the second output terminal $O_{12}$, and the source S of the N type IGFET 23N is connected to the negative power source $-V$ instead of being connected to the second output terminal $O_{12}$ as in FIG. 3. Therefore, it will be apparent from the foregoing description that conversely to FIG. 3, the circuit arrangement of FIG. 4 performs in the positive logic operation three NOR functions:

$$O_{11}=\overline{I_{11}}$$
$$O_{12}=\overline{I_{11}+I_{12}}$$
$$O_{13}=\overline{I_{11}+I_{12}+I_{13}}$$

and in the negative logic operation three NAND functions:

$$O_{11}=\overline{I_{11}}$$
$$O_{12}=\overline{I_{11}\times I_{12}}$$
$$O_{13}=\overline{I_{11}\times I_{12}\times I_{13}}$$

FIG. 5 illustrates an OR/AND circuit arrangement according to still another embodiment of this invention. The P type IGFET 21P to 23P and N type IGFET 21N to 23N of the logic circuit units 21 to 23 as well as their sources S and drains D are connected in reverse relationship to the circuit arrangement of FIG. 3. The sources S of each paired IGFET 21P–21N, 22P–22N and 23P–23N are connected to the corresponding output terminals $O_{11}$, $O_{12}$ and $O_{13}$. The drains D of the N type IGFET 21N to 23N are grounded. The drain D of the P type IGFET 21P is connected to the negative bias power source $-V$. The drain D of the P type IGFET 22P is connected to the first output terminal $O_{11}$ and the drain D of the P type IGFET 23P to the second output terminal $O_{12}$.

When, under the aformentioned circuit arrangement, the input terminal of a given logic circuit unit among those 21 to 23 is supplied with 0 input, the P type IGFET of the corresponding logic circuit until is rendered conducting and the N type IGFET thereof is rendered nonconducting. Therefore, the output terminal of said logic circuit unit has equal voltage to the voltage $-V$ volts of the negative bias power source to produce 0 output with the same phase as the input. Conversely when the input terminal of a given logic circuit unit is supplied with 1 input, the N type IGFET of the corresponding logic circuit unit is rendered conducting and the P type IGFET is rendered nonconducting, producing 1 output having the same phase as the input. Accordingly, the logic circuit units of FIG. 5 draw out output having the same phase as input in contrast to the case of FIG. 3 where the logic circuit units act as an inverter generating output signals having a reverse phase to input signals, but in other respects are operated in the same way as in FIG. 3. Therefore, it will be easily understood by those skilled in the art that the circuit arrangement of FIG. 5 performs in the positive logic operation three OR functions:

$$O_{11}=I_{11}$$
$$O_{12}=I_{11}+I_{12}$$
$$O_{13}=I_{11}+I_{12}+I_{13}$$

namely, acts as an OR logic gate circuit and carries out in the negative logic operation three AND functions:

$O_{11}=I_{11}$ $O_{12}=I_{11}\times I_{12}$ $O_{13}=I_{11}\times I_{12}\times I_{13}$ that is, acts as an AND logic gate circuit.

Tables 5 and 6 present truth values associated with OR and AND operations.

Table 5(OR)

| $I_{11}$ | | $I_{12}$ | $O_{11}$ | $O_{12}$ | $O_{13}$ |
|---|---|---|---|---|---|
| 0 | 0 | 0 | 0 | 0 | 0 |
| 0 | 0 | 1 | 0 | 0 | 0 |
| 0 | 1 | 0 | 0 | 1 | 1 |
| 0 | 1 | 1 | 0 | 1 | 1 |
| 1 | 0 | 0 | 1 | 1 | 1 |
| 1 | 0 | 1 | 1 | 1 | 1 |
| 1 | 1 | 0 | 1 | 1 | 1 |
| 1 | 1 | 1 | 1 | 1 | 1 |

Table 6(AND)

| $I_{11}$ | $I_{12}$ | $I_{13}$ | $O_{11}$ | $O_{12}$ | $O_{13}$ |
|---|---|---|---|---|---|
| 1 | 1 | 1 | 1 | 1 | 1 |
| 1 | 1 | 0 | 1 | 1 | 0 |
| 1 | 0 | 1 | 1 | 0 | 0 |
| 1 | 0 | 0 | 1 | 0 | 0 |
| 0 | 1 | 1 | 0 | 0 | 0 |
| 0 | 1 | 0 | 0 | 0 | 0 |
| 0 | 0 | 1 | 0 | 0 | 0 |
| 0 | 0 | 0 | 0 | 0 | 0 |

FIG. 6 indicates an AND/OR logic circuit arrangement according to still another embodiment of this invention. The P type IGFET 21P to 23P and N type IGFET 21N to 23N as well as their sources S and drains D are connected in reverse relationship to the circuit arrangement of FIG. 4. The circuit arrangement of FIG. 6 generates output having the same phase as input as in FIG. 5 and in other respects is operated in the same way as in FIG. 4. Namely, the circuit arrangement of FIG. 6 acts in the positive logic operation as an AND logic gate circuit performing three AND functions:

$O_{11}=I_{11}$ $O_{12}=I_{11}\times I_{12}$ $O_{13}=I_{11}\times I_{12}\times I_{12}$ and acts in the negative logic operation as an OR logic gate circuit carrying out three OR functions:

$O_{11}=I_{11}$ $O_{12}=I_{11}+I_{12}$ $O_{13}=I_{11}+I_{12}+I_{13}$

FIG. 7 represents a general setup of a NAND/NOR logic circuit arrangement of this invention having an arbitrary n number of inputs in which there are provided an n number of logic circuit units 2*l* to 2*n*. As apparent from the description of FIG. 3, the circuit arrangement of FIG. 7 performs in the positive logic operation an n number of NAND functions:

$O_{11}=\overline{I_{11}}$ $O_{12}=\overline{I_{11}\times I_{12}}$ $O_{13}=\overline{I_{11}\times I_{12}\times I_{13}}$

.

.

.

$O_{1n}=\overline{I_{11}\times I_{12}\times I_{13}\times\ .\ .\ .\ I_{1n}}$ and carries out in the negative logic operation an *n* number of NOR functions:

$O_{11}=\overline{I_{11}}$ $O_{12}=\overline{I_{11}+I_{12}}$ $O_{13}=\overline{I_{11}+I_{12}+I_{13}}$

.

.

.

$O_{1n}=\overline{I_{11}+I_{12}+I_{13}+\ .\ .\ .\ I_{1n}}$

FIG. 8 shows a general setup of a NOR/NAND logic circuit arrangement of this invention having an arbitrary *n* number of inputs, in which there are provided an *n* number of logic circuit units 2*l* to 2*n*. As apparent from the description of FIG. 4, the circuit arrangement of FIG. 8 performs in the positive logic operation an n number of NOR functions:

$O_{11}=\overline{I_{11}}$ $O_{12}=\overline{I_{11}+I_{12}}$ $O_{13}=\overline{I_{11}+I_{12}+I_{13}}$

.

.

.

$O_{1n}=\overline{I_{11}+I_{12}+I_{13}+\ .\ .\ .\ I_{1n}}$ and carries out in the negative logic operation an *n* number of NAND functions:

$O_{11}=\overline{I_{11}}$ $O_{12}=\overline{I_{11}\times I_{12}}$ $O_{13}=\overline{I_{11}\times I_{12}\times I_{13}}$

.

.

.

$O_{1n}=\overline{I_{11}\times I_{12}\times I_{13}\times\ .\ .\ .\ I_{1n}}$

Figure 9:
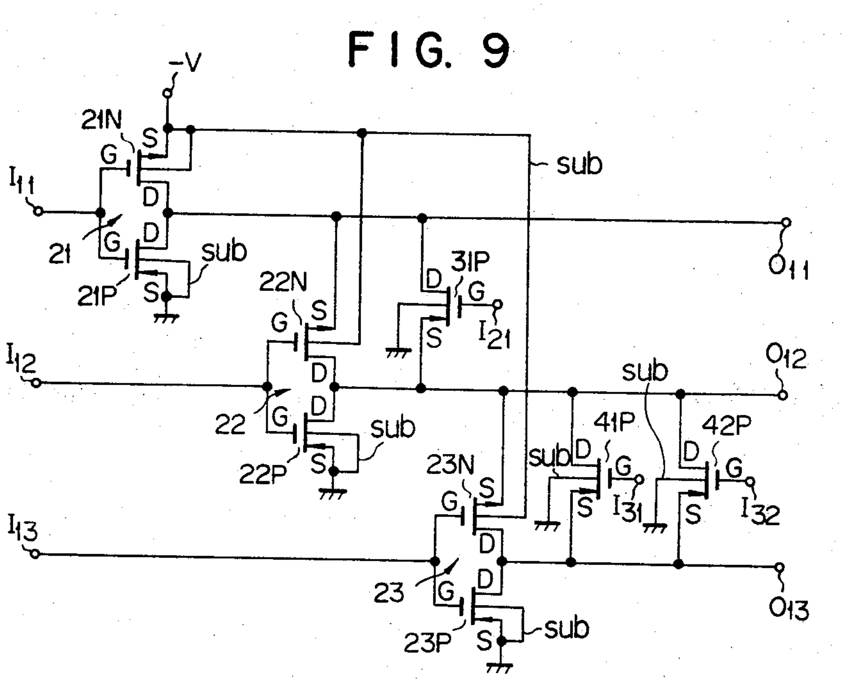

FIG. 9 is a circuit arrangement inproved from that of FIG. 3. With respect to the combination of inputs $I_{11}=0$, $I_{12}=1$ and $I_{13}=0$ in the positive logic operation as used in FIG. 3, the circuit arrangement of FIG. 9 causes IGFET 21P, 22N and 23P to be rendered conducting and IGFET 21N, 22P and 23N to be made nonconducting. As viewed from the output terminal $O_{12}$, therefore, the N type IGFET 22N assumes the so-called source follower mode (or back gate bias mode). As a result, the voltage impressed on the output terminal $O_{12}$ through the N type IGFET 22N thus rendered conducting does not have a desired grounding level but takes the form of a threshold voltage VthN modulated as indicated by the $$\left.\begin{aligned}|O_{12}|&=|VthN|\\|VthN|&\propto|A+B\sqrt{|\phi_s+V_{BG}|}|\end{aligned}\right\}\qquad(1)$$

where:

A and B = values determined by the form and physical constant of the N type IGFET 22N $\phi_S$ = surface level of the semiconductor substrate of said N type IGFET 22N $V_{BG}$ = bias voltage of the substrate electrode Sub with respect to the source voltage of said N type IGFET 22N (in the circuit arrangement of FIG. 9 $V_{BG}$ is set at −V volts)

The reason why in the aforesaid case, the N type IGFET 22N presents the source follower mode originates with the fact that the voltages of the source S and drain D approach the grounding voltage and indicate a different level from the voltage −V volts of the substrate electrode Sub. Occurrence of such different voltage levels causes the output terminal $O_{12}$ to be supplied with the threshold voltage VthN attenuated by a voltage drop, with the resultant possibility of readout being erroneously carried out or obstructed. The sources S and drains D of the remaining P type IGFET 21P and 23P already rendered conducting have voltage approaching the grounding level and the substrate electrodes thereof Sub are additionally supplied with the grounding voltage. Accordingly, the IGFET 21P and 23P do not present the aforementioned source follower mode, but take the source grounded mode, so that there does not occur any voltage drop in the voltage supplied to the output terminals $O_{11}$ and $O_{13}$ through said IGFET 21P and 23P, preventing read out from being erroneously carried out or obstructed Also in the case of $I_{11}$=o, $I_{12}$ =1 and $I_{13}$=1, the N type IGFET 22N of the second logic circuit unit indicates the source follower mode. In the three cases of $I_{11}$=0, $I_{12}$=0 and $I_{13}$=1, $I_{11}$=0, $I_{12}$=1 and $I_{13}$=1, and $I_{11}$=1, $I_{12}$=0 and $I_{13}$=1, the N type IGFET 23N of the third logic circuit unit takes the source follower mode as in the preceding case, preventing a desired voltage from being supplied to the output terminal $O_{13}$.

With respect to the negative operation, the N type IGFET 22N of the second logic circuit unit assumes the source follower mode under the conditions corresponding to the two conditions in the positive logic operation, that is, in the two cases of $I_{11}$=1, $I_{12}$=0 and $I_{12}$=1 nd $I_{11}$=1, $I_{12}$=0 and $I_{13}$=0. The N type IGFET 23N of the third logic circuit unit also presents in the negative logic operation said source follower mode under the conditions corresponding to the three conditions in the positive logic operation, that is, in the cases $I_{11}$=1, $I_{12}$=1 and $I_{13}$=0, $I_{11}$=1, $I_{12}$=0 and $I_{13}$=0, $I_{11}$=1, $I_{12}$=1 adn $I_{13}$=0.

The circuit arrangement of FIG. 9, therefore, is so designed as to prevent any IGFET from presenting such source follower mode, and enable it to take an equivalent mode to the source grounded mode, no matter how inputs are combined. Namely, between the first and second output terminals $O_{11}$ and $O_{12}$ are connected in parallel the source-drain path of an additional P type IGFET 31P having an opposite channel type, in the case of FIG. 9, to the N type IGFET 22N of the second logic circuit unit 22 which is disposed between said output terminals Oand $O_{12}$ to perform the aforementioned NAND/NOR logic functions. The input terminal $I_{21}$ of said additional P type IGFET 31P is supplied with the same input as that which is impressed on the input terminal $I_{11}$ of the first logic circuit unit 21.

Between the second and third output terminals $O_{12}$ and $O_{13}$ there are connected in parallel the source-drain paths of two additional P type IGFET 41P and 42P each having an opposite channel type, in the case of FIG. 9, to the N type IGFET 23N of the third logic circuit unit 23 which is disposed between the output terminals $O_{12}$ and $O_{13}$. The input terminals $I_{31}$ and $I_{32}$ of said two additional P type IGFET 41P and 42P are separately supplied with the same input as those which are impressed on the input terminals $I_{11}$ and $I_{12}$ respectively of the first and second logic circuit units 21 and 22.

According to the circuit arrangement of FIG. 9, the N type IGFET 22N of the second logic circuit unit 22 presents the souce follower mode only in the two cases where the input terminal $I_{11}$ of the first logic circuit unit 21 is supplied with 0 in the positive logic operation (or conversely with 1 in the negative logic operation). When, therefore, there is supplied the same input as said 0 or 1 to the additional IGFET 31P, said IGFET 31P is rendered conducting by the source grounded mode, enabling the output terminal $O_{12}$ to be supplied with proper grounding voltage.

In the positive logic operation, the N type IGFET 23N of the third logic circuit unit 23 takes the source follower mode in the three cases: where both the input terminals $I_{11}$ and $I_{12}$ of the first and second logic circuit units 21 and 22 are supplied with 0 input; where only the first input terminal $I_{11}$ of the first and second logic circuit units is supplied with 0 input; and where only the second input terminal $I_{12}$ of the first and second logic circuit units is supplied with 0 input. Conversely in the negative logic operation, the 0 input is replaced by the 1 input. When, therefore, there are connected the second and third output terminals $O_{12}$ and $O_{13}$ two P type IGFET 41P and 42P to be supplied with said 0 or 1 input, then either of these IGFET 41P and 42P never fails to be made conducting by the source grounded mode if the N type IGFET 23N of the third logic circuit unit presents the source follower mode, enabling proper grounding voltage to be supplied to the output terminal $O_{13}$.

With respect to the positive logic operation (NOR function), the circuit arrangement of FIG. 4 causes, as in FIG. 3, the P type IGFET 22P of the second logic circuit unit 22 to present such source follower mode as viewed from the output terminal $O_{12}$ in the two cases of $I_{11}$=1, $I_{12}$=0 and $I_{12}$=1 and $I_{11}$=1, $I_{12}$=0 and $I_{13}$=0. Similarly, the P type IGFET 23P of the third logic circuit unit 23 takes the source follower mode as viewed from the output terminal $O_{13}$ in the three cases of $I_{11}$=1, $I_{12}$=1 nd $I_{13}$=0, and $I_{13}$=0, and $I_{11}$=0, $I_{12}$=1 and $I_{13}$=0. When, therefore, the input terminals $I_{11}$ to $I_{13}$ are supplied with inputs combined in the aforesaid five forms, then the output terminals $O_{12}$ or $O_{13}$ is not supplied with the desired bias power source voltage −V volts, but with the threshold voltage VthP of the Ptype IGFET modulated as indicated by the following equation in a form attenuated by a voltage drop.

$$\left.\begin{aligned} |0_{12} \text{ or } 0_{13}| &= |V-VthP| \\ |VthP| &\propto |A+B\sqrt{|\phi_S+V_{BG}|}| \end{aligned}\right\} \quad (2)$$

Referring to the circuit arrangement of FIG. 4, the P type IGFET 22P of the second logic circuit units 22 presents in the negative logic operation the source follower mode in the two cases of $I_{11}$=0, $I_{12}$=1 and $I_{13}$=0 and $I_{11}$=0, $I_{12}$=1 and $I_{13}$=1 corresponding to the two conditions of the positive logic operation. And the P type IGFET 23P of the third logic circuit unit 23 similarly indicates in the negative logic operation the source follower mode in the three cases of $I_{11}$=0, $I_{12}$=0 and $I_{13}$=1, $I_{11}$=0, $I_{12}$=1 and $I_{13}$=1, $I_{11}$=1, $I_{12}$=0 and $I_{13}$=1.

The P type IGFET 22P of the second logic circuit unit 22 takes the source follower mode in the positive logic operation in the two cases where the input terminal $I_{11}$ of the first logic circuit unit 21 is supplied with 1 input (or conversely with 0 input in the negative logic operation).

On the other hand, the P type IGFET 23P of the third logic circuit unit 23 indicates the source follower mode in the positive logic operation in the three cases: wherei both the input terminals $I_{11}$ and $I_2$ of the first and second logic circuit units 21 and 22 are supplied with 1 input; where only the first input terminal $I_{11}$ of the first and second logic circuit units is supplied with 1 input; nd where only the second input terminal $I_{12}$ of the first and second logic circuit units is supplied with 1 input (or conversely with 0 input in the negative logic operation).

Figure 10:
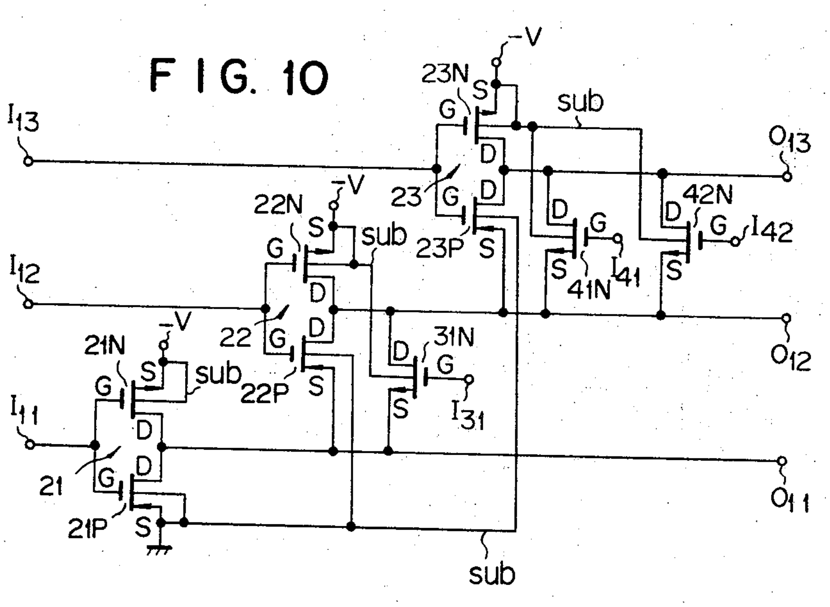

The circuit arrangement of FIG. 10 is so improved as to prevent the P type IGFET 22P and 23P from taking the source follower mode in case where there are supplied such combinations fo input as occurring in the circuit arrangement of FIG. 4 and enable said P type IGFET 22P and 23P to present the source grounded mode without fail.

According to the circuit arrangement of FIG. 10 there is provided between the first and second output terminals $O_{11}$ and $O_{12}$ an additional N type IGFET 31 N having its source-drain path disposed in parallel with the P type IGFET 22P of the second logic circuit unit 22 having its source-drain path connected between the first and second output terminals $O_{11}$ and $O_{12}$. The input terminal $I_{21}$ of said additional N type IGFET 31N connected to the gate G is supplied with the same input as that which is impressed on the input terminal $I_{11}$ of the first logic circuit unit 21. Further between the second and third output terminals $O_{12}$ and $O_{13}$ there are provided two additional N type IGFET 41N and 42N having the source-drain paths thereof disposed in parallel with the P type IGFET 23P of the third logic circuit unit 23 having ts source-drain path connected between said second and third output terminals $O_{12}$ and $O_{13}$. The input terminals $I_{31}$ and $I_{32}$ connect to the gates G of said N type IGFET 41N and 42N are separately supplied with the same input as those which are impressed on the input terminals $I_{11}$ and $I_{12}$ respectively of the first and second logic circuit units 21 and 22.

According to the circuit arrangement of FIG. 10, when the P type IGFET 22P of the second logic circuit unit 22 takes the source follower mode upon supply of inputs combined in the aforesaid specified forms, the additional N type IGFET 31N connected in parallel with said P type IGFET 22P never fails to be rendered conducting to indicate the source grounded mode, enabling the output terminal $O_{12}$ to be supplied with proper bias power source voltage −V. Similarly when the P type IGFET 23P of the third logic circuit unit 23 presents the source follower mode upon supply of inputs combined in the aforesaid specified forms then either of the two additional N type IGFET 41N and 42N each connected in parallel with said P type IGFET 23P is rendered conducting without terminal $O_{13}$ to be supplied with proper bias power source voltage −V.

Figure 11:
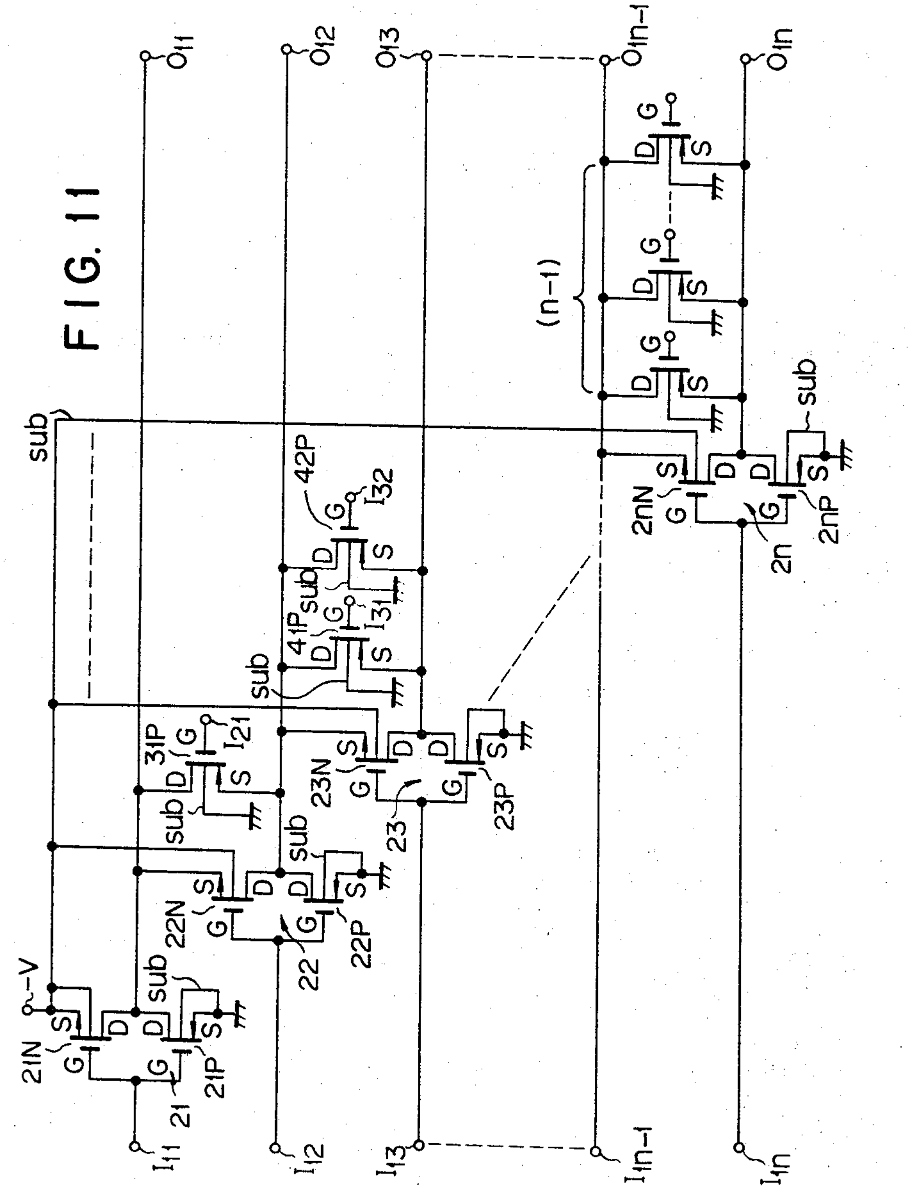

With respect to the normalized NAND/NOR logic gate circuit having an n number of input terminals and the same number of output terminals as in FIG. 7, the N type IGFET 22N, 23N . . . 2nN of the second, third . . . *n*th logic circuit units 22, 23 . . . 2*n* similarly present the source follower mode upon supply of inputs combined in the aforesaid specified forms. To eliminate the occurence of said mode, there is provided the additional P type IGFET 31P having its source-drain path connected between the first and second output terminals $O_{11}$ and $O_{12}$ as shown in FIG. 11. Also between the second and third output terminals $O_{12}$ and $O_{13}$ there are provided the two additional P type IGFET 41P and 42P having the source-drain paths thereof connected between said second and third output terminals $O_{12}$ and $O_{13}$. In the same manner, there are provided between the output terminals $O_{1n-1}$ and $O_{1n}$ of the $(n-1)$ and $(n)$ orders an $(n-1)$ number of additional P type IGFET having the source-drain paths thereof connected between said output terminals $O_{1n-1}$ and $O_{1n}$. Said additional IGFET are separately supplied with the same input as those which are impressed on the respective immediately preceding input terminals.

According to the circuit arrangement of FIG. 11, when the N type IGFET 22N, 23N . . . 2nN indicate the source follower mode upon supply of inputs combined in the aforesaid specified forms to the input terminals $I_{11}$, $I_{12}$, $I_{13}$. . . $I_{1n-1}$, $I_{1n}$, then at least one of the additional P type IGFET connected in parallel with the corresponding N type IGFET never fails to be rendered conducting to present the source grounded mode, enabling the corresponding output terminal $O_{12}$, $O_{13}$ . . . $O_{1n-1}$ or $O_{1n}$ to be supplied with proper grounding voltage as experimentally confirmed by the present inventor.

With respect to a normalized NOR/NAND logic gate circuit having an n number of input terminals and the same number of output terminals as in FIG. 8, the P ype IGFET 22P, 23P . . . 1*nP* of the second, third and *n*-order logic circuit units 22, 23 . . . 2*n* take the source follower mode upon supply of inputs combined in the aforementioned specified forms. To eliminate occurrence of said mode, there is provided between the first and second output terminals $O_{11}$ and $O_{12}$ the additional N type IGFET 31Nhaving its source-drain path connected between said output terminals $O_{11}$ and $O_{12}$. Further between the second and third output terminals $O_{12}$ and $O_{13}$ there are provided the two additional N type IGFET 41N and 42N having the source-drain paths thereof connected between said output terminals $O_{12}$ and $O_{13}$. In the same manner there are provided between the output terminals $O_{1n-1}$ and $O_{1n}$ of the $(n-1)$ and n orders an $(n-1)$ number of additional N type IGFET having the source-drain paths thereof connected between said output terminals $O_{1n}-1$ and $O_{1n}$. Said additional IGFET are separately supplied with the same input as those which are impressed on the respective immediately preceding input terminals.

Figure 12:
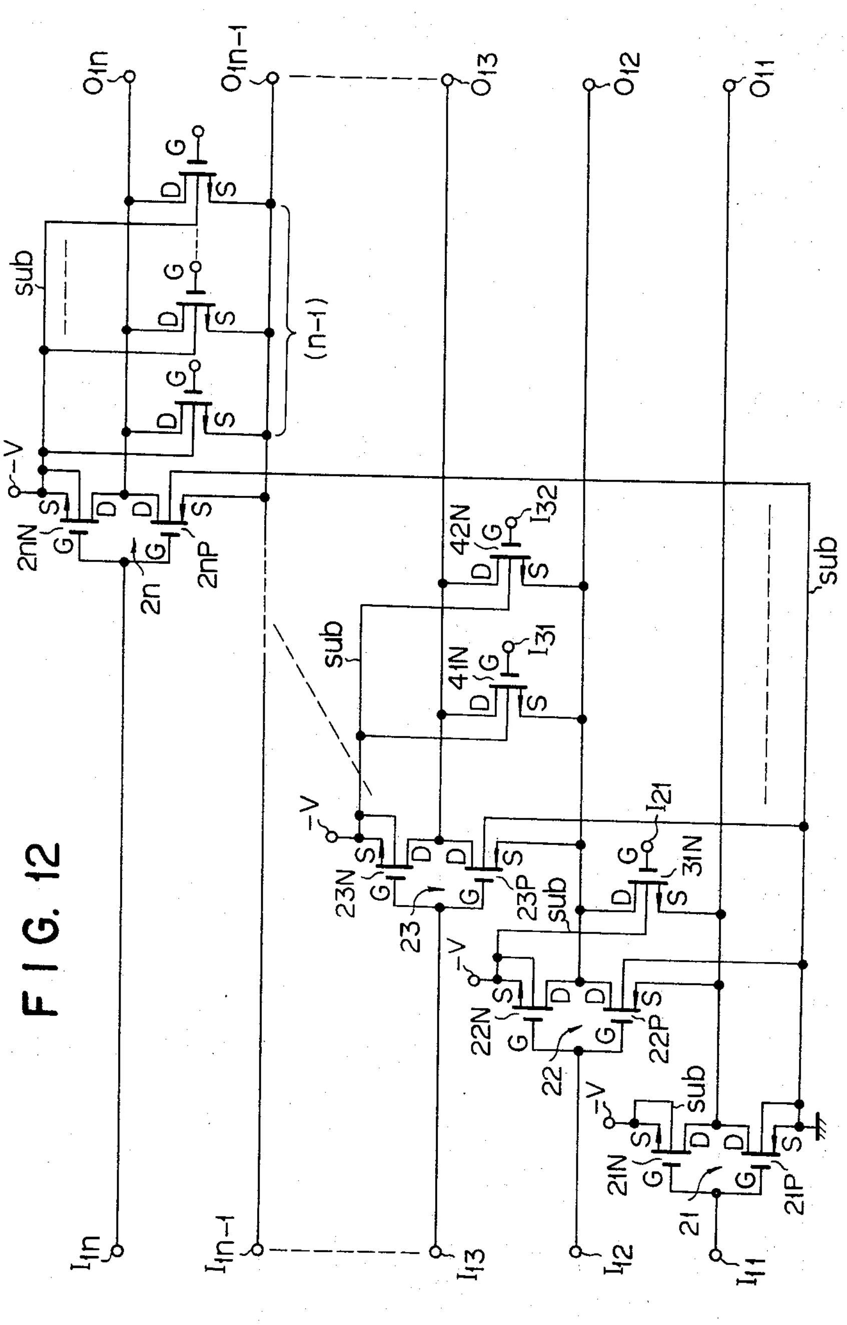

According to the circuit arrangement of FIG. 12, when the P type IGFET 22P, 23P . . . 2*nP* take the source follower mode upon supply of inputs combined in the aforesaid specified forms to the input terminals $I_{11}$, $I_{12}$, $I_{13}$ . . . $I_{1n-1}$ as in FIG. 11, then at least one of the additional N type IGFET connected in parallel with said P type IGFET never fails to be rendered conducting so as to take the source grounded mode, enabling the corresponding output terminal $O_{12}$, $O_{13}$ . . . $O_{1n-1}$ or $O_{1n}$ to be supplied with proper bias power source voltage −V volts as experimentally proved by the present inventor. It will be noted that provision of the aforesaid additional IGFET does not have any harmful effect on other logical functions when there are supplied inputs in a combined form representing other modes than the source follower mode.

Since the P and N type IGFET used in this invention are unipolar transistors instead of ordinary bipolar ones, the source S and drain D thereof may be interchangeably arranged as is well known to those skilled in the art.

What is claimed is:

1. A NAND/NOR logic circuit arrangement capable of multiplex logic operation comprising:

a plurality of interconnected logic circuit units each of which comprises a pair of enhancement type IGFET's each pair including one P channel and one N channel IGFET connected in complementary relationship to each other;

a plurality of input terminals connected to the gates of each of said paired IGFET's;

a plurality of output terminals respectively connected to the drains of each of said paired IGFET's;

means for connecting the sources of the P type IGFET of the logic circuit units to a positive bias power source;

means for connecting the source of the N type IGFET of a first logic circuit unit to the negative bias power source;

means for connecting the sources of the N type IGFET of a second and succeeding logic circuit units to the output terminals of the respective immediately preceding logic circuit units;

means for connecting the substrate electrodes of the P type IGFET of the logic circuit units to the positive bias power source and connecting those of the N type IGFET thereof to the negative bias power source;

circuit means which, when the input terminals of the logic circuit units are supplied with inputs combined in arbitrary forms in which the voltages of the positive and negative bias power sources are taken as 1 and 0 digits respectively of the binary logic level or vice versa, is responsive to the respective outputs from the output terminals for generating logic outputs corresponding to the combinations of inputs up to the associated logic circuit units; and a ($n-1$) number of additional P type IGFET's, having their source-drain paths connected between the output terminals of the ($n-1$) and n orders and in parallel with the N type IGFET of the logic circuit units of the n order and having their gates supplied with the same input as those impressed on the input terminals of the respective immediately preceding logic circuit units, whereby, when the N type IGFET of the logic circuit units of the $n$ order take a source follower mode upon supply of inputs combined in the specified forms to all the input terminals, then at least one of the additional P type IGFET's is positively rendered conducting to take a source grounded mode.

2. A NOR/NAND logic circuit arrangement capable of multiplex logic operation comprising:

a plurality of interconnected logic circuit units each of which comprises a pair of enhancement type IGFET's, each pair including one P channel and one N channel IGFET connected in complementary relationship to each other;

a plurality of input terminals connected to the gates of each of said paired IGFET's;

a plurality of output terminals respectively connected to the drains of each of said paired IGFET's;

means for connecting the sources of the N type IGFET of the logic circuit units to a negative bias power source;

means for connecting the source of the P type IGFET of a first logic circuit unit to a positive bias power source;

means for connecting the sources of the P type IGFET of a source and succeeding logic circuit units to the output terminals of the respective immediately preceding logic circuit units;

means for connecting the substrate electrodes of the P tyoe IGFET of the logic circuit units to the positive bias power source and connecting those of the N type IGFET thereof to the negative bias power source;

circuit means which, when the input terminals of the logic circuit units are supplied with inputs combined in arbitrary forms in which the voltages of the positive and negative bias power sources are taken as 1 and 0 digits respectively of the binary logic level or vice versa, is responsive to the respective outputs from the output terminals for generating logic outputs corresponding to the combinations of inputs up to the associated logic circuit units; and an ($n-1$) number of additional N type IGFET's having their source-drain paths connected between the output terminals of the ($n-1$) and $n$ orders and in parallel with the P type IGFET of the logic circuit units of the $n$ order and having their gates supplied with the same input as those impressed on the input terminals of the respective immediately preceding logic circuit units, whereby, when the P type IGFET of the logic circuit units of the n order take a source follower mode upon supply of inputs combined in the specified forms to all the input terminals, then at least one of the additional N type IGFET's is positively rendered conducting to take a source grounded mode.

* * * * *